United States Patent [19]

Harlos et al.

[11] Patent Number: 4,857,779
[45] Date of Patent: Aug. 15, 1989

[54] CIRCUIT ARRANGEMENT FOR REDUCING NOISE

[75] Inventors: Hartmut Harlos, Hamburg; Peter Kelting, Elmshorn, both of Fed. Rep. of Germany

[73] Assignee: U.S. Philips Corporation, New York, N.Y.

[21] Appl. No.: 208,195

[22] Filed: Jun. 16, 1988

[30] Foreign Application Priority Data

Jun. 24, 1987 [DE] Fed. Rep. of Germany ....... 3720871
Mar. 16, 1988 [DE] Fed. Rep. of Germany ....... 3808737

[51] Int. Cl.$^4$ .............................................. H03K 5/08
[52] U.S. Cl. ..................... 307/542; 307/263; 307/555; 328/164; 328/165; 358/167
[58] Field of Search ............... 307/263, 264, 268, 542, 307/555; 358/166, 167; 328/164, 165

[56] References Cited

U.S. PATENT DOCUMENTS

| | | | |
|---|---|---|---|
| 4,030,121 | 6/1977 | Faroudja | 307/263 |
| 4,362,955 | 12/1982 | Davenport | 307/264 |
| 4,758,891 | 7/1988 | Hitchcock | 358/166 |

Primary Examiner—John Zazworsky
Attorney, Agent, or Firm—Edward W. Goodman

[57] ABSTRACT

A circuit arrangement for reducing noise when peaking the edges of a useful signal (S1) by combination with a peaking signal (S3) derived therefrom, which signal only influences the useful signal (S1) when a predetermined amplitude threshold is exceeded, which arrangement has a peaking signal stage (20) for supplying the peaking signal (S3) and a noise suppression stage (7) in which a noise suppression signal is generated and is superimposed on the peaking signal (S3), while the peaking signal stage (20) applies the peaking signal (S3) to two push-pull current outputs (21, 22) provides the possibility of a very simple circuit structure, particularly with a view to a space-saving integration on a semiconductor crystal in that each of the push-pull current outputs (21, 22) in the noise suppression stage (7) is connected to a series resistor (23, 24) and to the control terminal of one of two transistors (25, 26) whose main current paths at one end are connected together and to a supply current source (27) and at their other end are connected to the terminal of the associated series resistor (23, 24) remote from the push-pull current output (21, 22, respectively).

9 Claims, 6 Drawing Sheets

a) S0
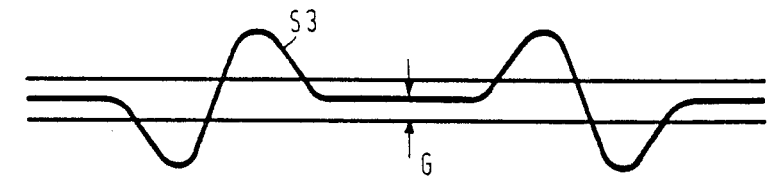
b) S3 G
Fig. 3
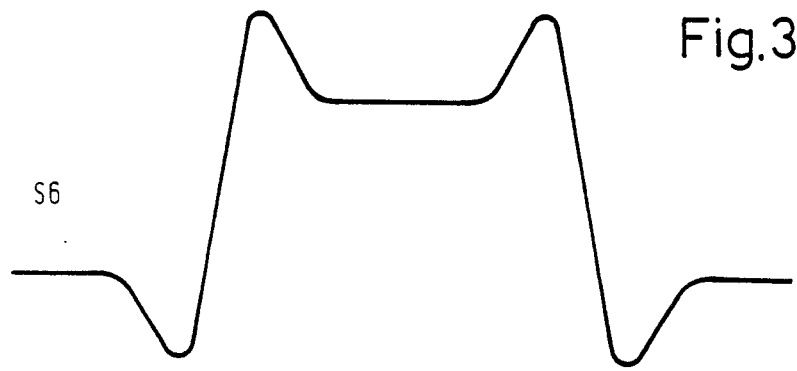
c) S6
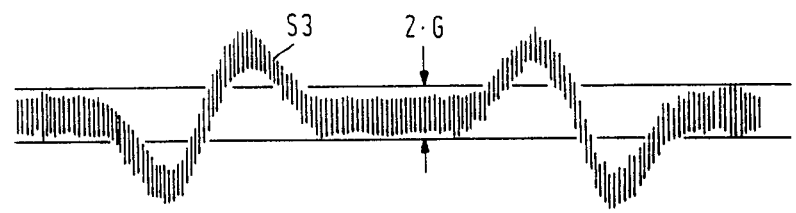
d) S3 2·G
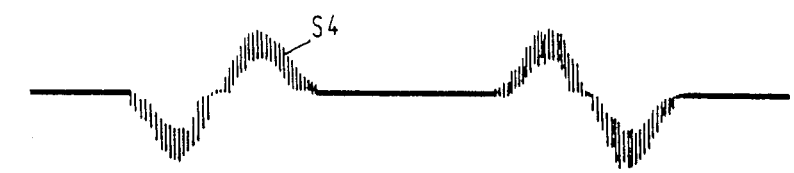
e) S4

CIRCUIT ARRANGEMENT FOR REDUCING NOISE

BACKGROUND OF THE INVENTION

The invention relates to a circuit arrangement for reducing noise when peaking the edges of a useful signal by combination with a peaking signal derived therefrom, which signal only influences the useful signal when a predetermined amplitude threshold is exceeded, said arrangement comprising a peaking signal stage for supplying the peaking signal and a noise suppression stage in which a noise suppression signal is generated and is superimposed on the peaking signal, the peaking signal stage applying the peaking signal to two push-pull current outputs.

A circuit arrangement for reducing noise is known from U.S. Pat. No. 4,536,796, particularly FIG. 3 and the associated description, which circuit arrangement forms a peaking signal from a video signal via a linear differential amplifier and a so-called coring signal via a two-stage limiter amplifier. The signal, which is designated as peaking signal and is applied to two push-pull outputs by the linear differential amplifier, is superimposed with the coring signal forming a cored-peaking signal which is subsequently combined with the video signal.

A circuit arrangement for processing a colour video signal comprising an arrangement for correcting definition is known from DE-PS No. 31 36 217. In this circuit arrangement a sub-signal is formed from the luminance signal of the colour video signal and it is added to the luminance signal for the purpose of correcting the definition. The definition correction does not become effective until the sub-signal exceeds a given minimum amplitude value determined by the adjustment of a threshold device. This device is represented by an amplitude-dependent controlled amplifier whose gain factor is substantially zero until the threshold value has been reached and which then assumes a finite value.

In arrangements for correcting definition, also referred to as aperture correction circuits, the amplitudes of the signal component having a higher frequency are raised to a higher value than those of the signal components of a lower frequency. Consequently, steeper signal edges are produced, which results in an improved picture definition, for example, in the video signal. Naturally, the amplitudes of noise signal components are also raised when generating the sub-signal. Particularly low-frequency video signal components having a small amplitude, such as occur in the display of uniform picture areas, have a noticeably poorer quality if they are beset with noise. The said threshold device counteracts this in that it suppresses noise signal components up to the amplitude threshold in the sub-signal.

SUMMARY OF THE INVENTION

It is an object of the invention to provide a circuit arrangement of the type described in the opening paragraph in a very simple circuit structure, particularly with a view to space-saving integration on a semiconductor crystal.

In the circuit arrangement of the type described in the opening paragraph this object is realised in that each of the push-pull current outputs in the noise suppression stage is connected to a series resistor and to the control terminal of one of two transistors whose main current paths at one end are connected together and to a supply current source and at the other end are connected to the terminal of the associated series resistor remote from the push-pull current output.

The circuit arrangement according to the invention can be used for processing any signal whose edges have become less steep, for example, due to transmission through a frequency band-limited transmission channel It is preferably suitable for processing a television signal for the purpose of enhancing the picture definition. On the one hand, the threshold device used for noise suppression and particularly the amplitude-dependent controlled amplifier constituting this device have a proportionally elaborate construction, and on the other hand they may themselves produce additional noise superimposed on the television signal. These drawbacks are obviated by the circuit arrangement according to the invention. In fact, the peaking signal can easily be superimposed on the anti-phase amplitude-limited noise suppression signal, resulting in an effective suppression of the noise in the peaking signal without simultaneously producing additional, noticeable noise. All modest amplitude noise is eliminated, whilst higher amplitude components in the peaking signal, reduced by the amplitude threshold, are maintained.

In the circuit arrangement according to the invention the noise suppression stage only comprises the series resistors, the transistors and the current source and thus it has a very simple construction. The current of the supply current source may be adjustable. This current directly determines the amplitude threshold which can therefore be easily controlled. Since the signal transmission paths in the circuit arrangement described only include the series resistors, no additional noise is produced in the noise suppression stage and the impedance ratios are not changed due to variations of the amplitude threshold. In spite of the adjusting facility, this always ensures identical signal transmission properties.

The working point of the peaking signal stage is stabilised to ensure a uniform amplitude threshold on either side of this working point. This is preferably effected by means of a working point control stage which forms an additional direct current for re-adjusting the direct current in at least one of the push-pull current outputs from a comparison of two voltages derived from the push-pull current outputs. Thus, the working point is always exactly in the middle of the control range determined by the amplitude thresholds and, dependent on the magnitude of the noise to be suppressed, this range only forms a small part of the overall control range for the peaking signal. Preferably, the direct currents in the push-pull current outputs are re-adjusted in opposite directions by the additional direct current in order to avoid working point shifts.

A very simple and effective structure for a working point control stage is obtained in that it comprises a constant current source whose current is split up into two components corresponding to the voltages derived from the push-pull current outputs, whilst the additional direct current corresponds to the difference between said components. The control sensitivity can then easily be adjusted by varying the current of the constant current source. The additional direct current may be supplied to various points in the circuit arrangement, for example, like a parallel-arranged current source to one of the push-pull current outputs, or preferably to the peaking signal stage itself for re-adjusting the direct currents required for working point adjustment.

The circuit arrangement according to the invention can also be used advantageously for operation at a lower supply voltage. Preferably, the peaking signal and/or the noise suppression signal can be applied via at least one current mirror circuit before they are superimposed. Signal currents constituting the peaking signal and/or the noise suppression signal, can be transferred very accurately with such current mirror arrangements without requiring a series arrangement of an excessive number of components or signal processing stages between two circuit points conveying only a small voltage difference. Particularly, at least one of the current mirror circuits in the signal path of the peaking signal is arranged between the terminals of the series resistors remote from the push-pull current outputs and a circuit point for superimposing the noise suppression signal. It is true that the current mirror arrangements require additional circuitry, but this is justifiable in view of the simplifications realised by means of the invention.

To avoid overshoot of the useful signal, a voltage limiter stage is used, which limits the peaking signal superimposed on the noise suppression signal in the polarity having the same direction as that of the useful signal, such that the amplitude of the useful signal combined with the peaking signal does not exceed a given value above the value of the useful signal. An overshoot, which has been introduced into the useful signal due to combination with the peaking signal, is thereby prevented from causing distortions and consequently additional noise at high useful signal amplitudes. The voltage of the peaking signal can either be limited independently of the amplitude of the useful signal or only when higher useful signal amplitudes occur. Particularly when peaking the edges of a television signal, a picture with reduced noise is also displayed in the area of contours.

BRIEF DESCRIPTION OF THE DRAWINGS

The invention will now be described in greater detail by way of example with reference to the accompanying drawings in which FIG. 3 shows some signal waveforms of the circuit arrangement according to FIG. 2.

DETAILED DESCRIPTION OF THE INVENTION

Figure 1:
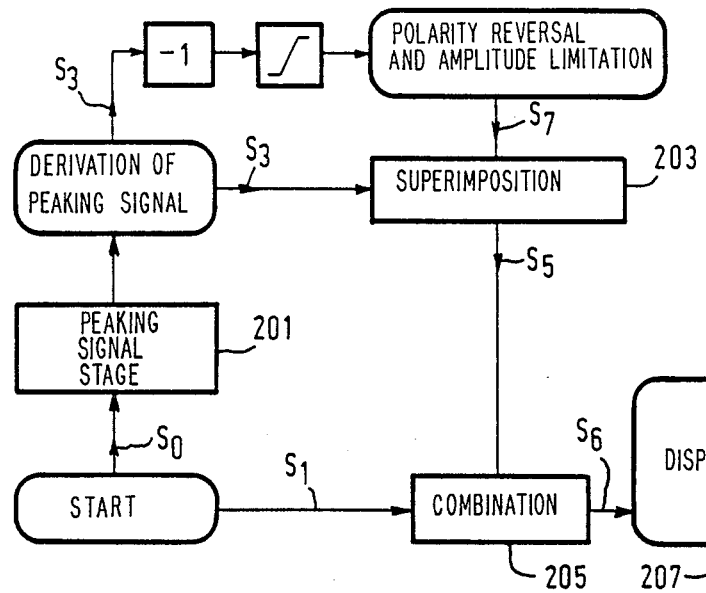
FIG. 1 is a diagrammatic representation of the method according to the invention.

The flow chart in FIG. 1 is a diagrammatic representation of a method of peaking the edges of a useful signal S0. This signal is applied to a peaking signal stage 201 in which a peaking signal S3 is derived from the useful signal. Various solutions can be used for deriving this signal. For example, in the peaking signal stage the differential quotient of the useful signal can be formed twice as a function of time, which quotient has a higher value in the area of the edges than in the area of a uniform signal variation. Another possibility is to delay the useful signal over several time intervals and to form a linear combination from the separately delayed signals and possibly from the undelayed useful signal. In any case a peaking signal is obtained which effects a steeper rise of the edges of the useful signal by means of combination, for example, addition or multiplication.

According to the invention the sign of the peaking signal S3 is reversed in a separate signal processing step before it is combined with the useful signal S0 adapted in time, said reversal being represented by a polarity reversal stage "−1". Subsequently, the signal is limited in amplitude, i.e. all signal components exceeding a given amplitude threshold are suppressed. The noise suppression signal S7 thus obtained is superimposed on the peaking signal in 203, preferably additively, and the peaking signal S5 thus modified is combined in 205 with the useful time adapted signal S1 forming S6 and displayed in 207.

Figure 2:
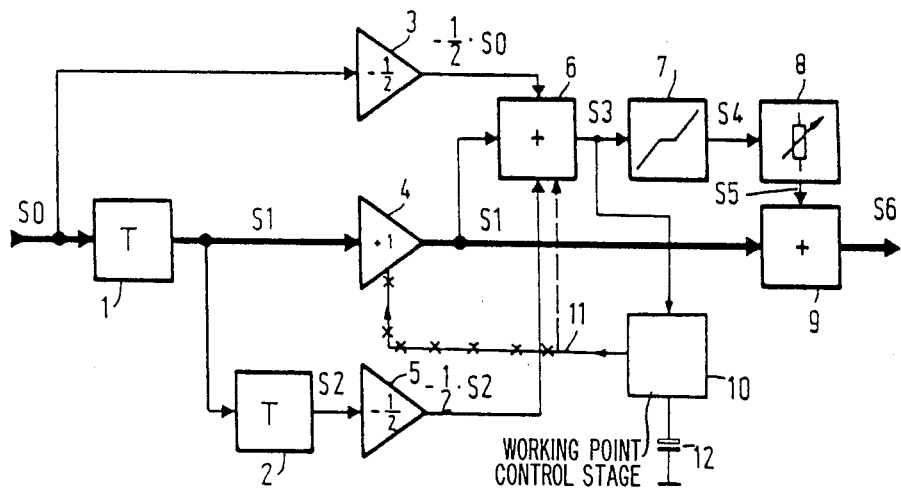
FIG. 2 is the block diagram of a circuit arrangement for carrying out the method according to the invention.

FIG. 2 shows an embodiment of a circuit arrangement with which such a signal processing step can be carried out and FIG. 3 shows some associated signal waveforms. The useful signal S0 is successively delayed by a delay time T in two delay stages 1 and 2. The signals S1 and S2 are then obtained.

The useful signal S0 and the delayed useful signals S1 and S2 are amplified in amplifier stages 3, 4 and 5, respectively, by given factors: the signals S0 and S2 are amplified by an amount which is $(-\frac{1}{2})$ as large as the amplification for the signal S1. The signals thus obtained are summed in a adder stage 6 and result in the peaking signal S3. This signal is applied to a noise suppression stage 7. It generates the noise suppression signal from the peaking signal S3 by way of polarity reversal and limitation and superimposes it on the peaking signal S3. The signal S4 thus obtained is applied via an adjusting stage 8 in which its amplitude is adjusted, i.e. for example via a voltage divider, resulting in the amplitude-adapted, low-noise peaking signal S5.

In the last step the singly delayed useful signal S1 is combined by means of a further adder stage 9 with the low noise peaking signal S5 to the useful signal S6 having peaked edges.

FIG. 3 shows some signal waveforms of the circuit arrangement according to FIG. 2. The mode of peaking the edges of the useful signal is explained with reference to a substantially trapezoidal useful signal S0 according to FIG. 3(a) for the case of a useful signal which is free from noise. The peaking signal stage shown in FIG. 2 and consisting of the delay stages 1, 2, the amplifier stages 3 and 5 and the adder stage 6 forms the peaking signal S3 shown in FIG. 3(b) from the (undelayed) useful signal S0. The peaking signal S3 disappears in the case of a uniform signal variation of the useful signal S0; the peaking signal S3 is different from zero only in the area of the edges in the useful signal S0. Assuming that the noise suppression stage 7 and the adjusting stage 8 allow the peaking signal S3 to pass in an unchanged form, the signals S4 and S5 directly follow the variation of S3. By superimposition of the peaking signal S3 on the delayed useful signal S1 in the adder stage 9, the useful signal S6 with steep edges shown in FIG. 3(c) is obtained. By adjusting the amplitude of the peaking signal S5 in the adjusting stage 8, the height of the overshoots in the useful signal S6 can be changed, dependent on the requirements, so as to reach a compromise between the edge steepness and the amplitude of the overshoots.

In the case of a useful signal S0 which is beset with noise particularly due to high frequency noise, a noise signal having a given amplitude is superimposed on this signal. When forming the peaking signal S3 its components are eliminated in the uniform variation range of the useful signal S0, but the components of the noise signal are not eliminated. The peaking signal S3 then acquires a variation shown in FIG. 3(d). If the signal S3 were combined in this form with the once delayed useful signal S1, a summation of the noise components in the useful signal S6 would result. These noise components would become disturbingly noticeable to a greater extent then in the useful signal S0, i.e. before peaking of the edges, particularly in the uniform signal variation ranges.

To suppress this noise, the polarity-reversed peaking signal limited to the amplitude threshold G is superimposed in the noise suppression stage 7 on the peaking signal according to FIG. 3(d). This means that all signal excursions located in the range of 2G around the zero axis, i.e. around the variation of the noise-free peaking signal S3 according to FIG. 3(b) in the uniform range of the useful signal S0 are eliminated, and that only signal values of S3 beyond this range occur in the peaking signal S4. This is shown in FIG. 3(e). By variation of the amplitude threshold G the noise suppression can be adapted to the amplitude of the noise signal component. If the low-noise peaking signal S4, or S5 with an adapted amplitude, is superimposed on the delayed useful signal S1, no addition noise will occur in the uniform ranges of the signal S1. This noise is only slightly higher in the range of the edges of the useful signal S1, but this is hardly considered to be disturbing, for example, in a useful video signal S0 or S6.

The circuit arrangement according to FIG. 2 also comprises a working point control stage 10 which forms a control signal from the peaking signal S3 and applied it to the amplifier stage 4 via a line 11 for the purpose of re-adjusting the working point. The value of the peaking signal S3 is re-adjusted via the signal S1 in the uniform range of the useful signal S0, i.e. the zero point of the peaking signal S3, in such a way that it is always in the centre between the values given by the amplitude threshold G. If the zero point were shifted, a correct noise suppression would no longer be ensured. For generating the control signal the working point control stage 10 preferably forms the central value of the peaking signal S3 via a smoothing capacitor 12.

The control signal may also be applied to the amplifier stages 3 or 5, while taking the gain and signal polarity into account; accordingly the line 11 should then be connected to these amplifier stages. A further possibility is to apply the control signal directly to the adder stage 6 via the line 11. For this case the line 11 is shown in a broken line in FIG. 2 and the crossed section of the line 11 is then separated.

Figure 4:
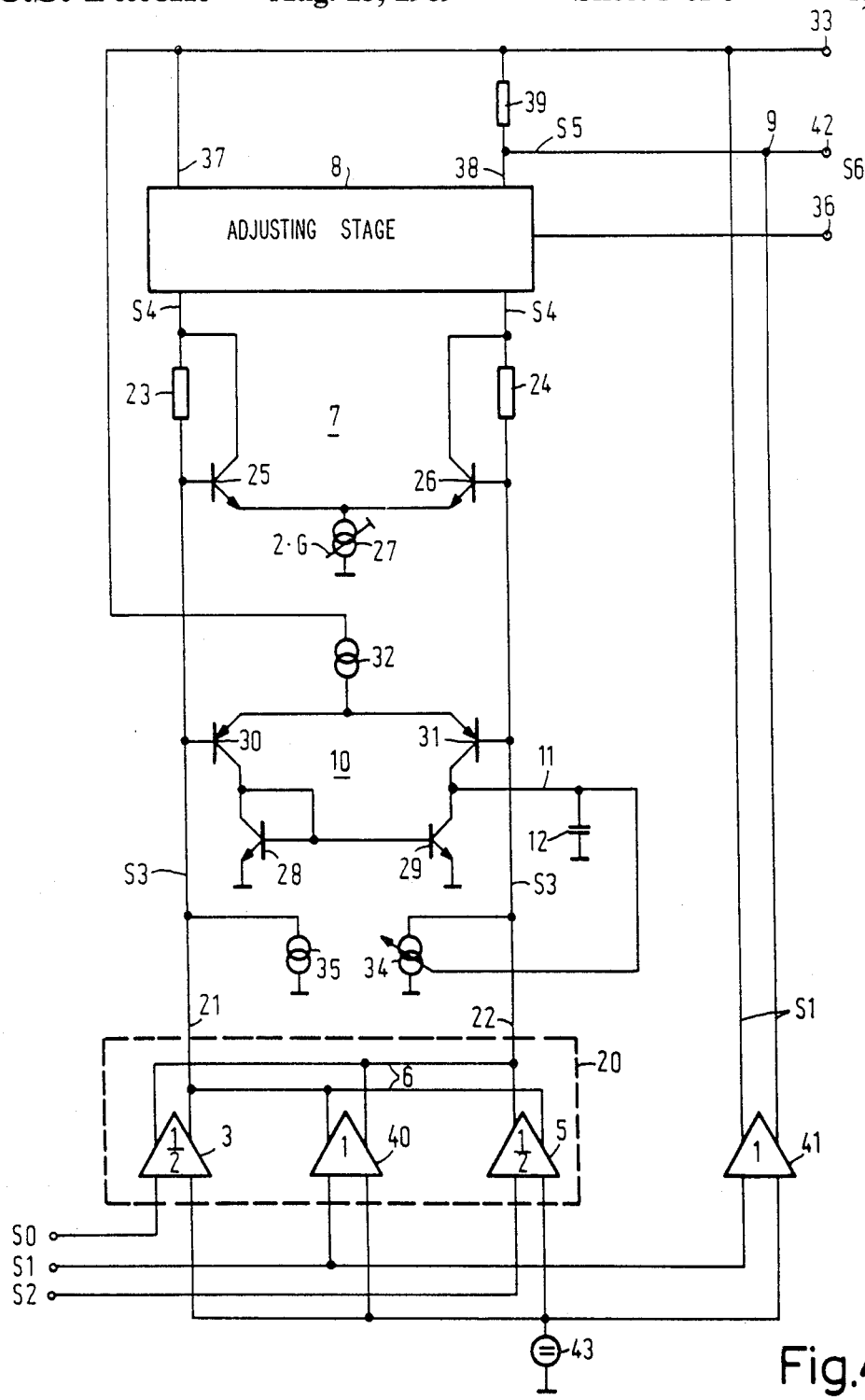
FIG. 4 shows a more detailed embodiment of a circuit arrangement according to the invention and FIG. 5 is a modification of the circuit arrangement of FIG. 4 in greater detail.

FIG. 4 shows a more detailed embodiment in which elements corresponding to those in the previous Figures have the same reference symbols. The amplifier stage 4 in the embodiment according to FIG. 4 is split up into two separate amplifier stages 40 and 41 in order to apply the delayed useful signal S1 in a decoupled form to the adder stages 6 and 9, respectively, which are each constituted by simple d.c. connections. The useful signal S0 and the signals derived therefrom are therefore represented by impressed currents. The amplifier stages 3, 40, 5 and the adder stage 6 together constitute the peaking signal stage 20 shown in a broken-line squire, which applies the peaking signal S3 to two push-pull current outputs 21, 22.

In the arrangement according to FIG. 4 the noise suppression stage 7 comprises two series resistors 23, 24 via which the push-pull current outputs 21 and 22 are connected to low-ohmic inputs of the adjusting stage 8. Each of the series resistors 23, 24 is shunted by the collector-base path of one of two transistors 25, 26 whose emitter terminals are connected in common to a terminal of a supply current source 27, whilst the other terminal of the supply current source is connected to ground. The transistors 25, 26 thus constitute an emitter-coupled differential amplifier by which the current supplied by the supply current source 27 is superimposed on the peaking signal S3 supplied by the push-pull current outputs 21, 22 in a division which is determined by the voltages at the base terminals of the transistors 25, 26. Due to the voltage drops at the series resistors, 23, 24 this division is directly determined by the peaking signal in such a way that the collector currents of the transistors 25, 26 compensate the currents constituting the peaking signal S3. Thus the signal S4 disappears in the control range of the peaking signal S3 determined by the current of the supply current source 27. The current of the supply current source 27 corresponds to the double value of the amplitude threshold G. If the peaking signal S3 disappears, the currents supplied by the push-pull current outputs 21, 22 and also the collector currents of the transistors 25, 26 are equally large. The current of the supply current source 27 is adjustable to enable the amplitude threshold to be changed.

Generally, the amplitude threshold is considerably smaller than the highest value of the peaking signal. Deviations, which are small as compared with this value, in the zero point and the working point of the peaking signal stage 20, i.e. deviations in the conformity between the currents supplied by the push-pull current outputs 21 and 22 in the case of a disappearing peaking signal S3 therefore result in a proportionally large asymmetry of the location of this zero point with respect to the amplitude thresholds. This asymmetry is counteracted by the working point control stage 10. In the arrangement according to FIG. 4 it comprises a grounded current mirror circuit comprising two current mirror transistors 28, 29 whose free terminals—in the present example the collector terminals of the bipolar transistors—are connected to a power supply terminal 33 via an emitter-coupled transistor pair 30, 31 and a constant current source 32 connected thereto. The current of the constant current source 32 is split up into two components corresponding to the voltages at the push-pull current outputs 21 and 22, which components flow through transistors 30, 28 on the one hand and 31 on the other hand. Moreover, the current in the transistor 30 is "mirrored" by the current mirror circuit 28, 29 in the current mirror transistor 29 so that the line 11 connected to the junction point between the transistor 31 and the current mirror transistor 29 conveys a signal which corresponds to the difference between the components of the currents of the constant current source 32. This signal is freed from video signal components by the smoothing capacitor 12 and is applied as a control signal to an adjustable working point current source 34 which, together with a further working point current source 35, determines the zero point of the peaking signal.

The adjusting stage 8 receives an adjusting signal via an adjusting input 36 for adjusting the amplitude of the low-noise peaking signal S4 in this stage. The adjusting stage 8 also supplies the amplitude-adapted peaking signal S5 via push-pull current outputs 37, 38 one of which is directly connected to the power supply terminal 33 and the other is connected to this terminal via a working resistor 39. The signal S5 from the push-pull current output 38 is combined with the delayed useful signal S1 at the junction point constituting the adder stage 9 with one of the outputs of the amplifier stage 41 and this signal is supplied as a useful signal S6 with peaked edges at the output 42. The amplifier stages 3, 40, 5, 41 are formed as differential amplifier stages in this embodiment, each reference input of which receives a reference voltage from a reference voltage source 43.

Figure 5:
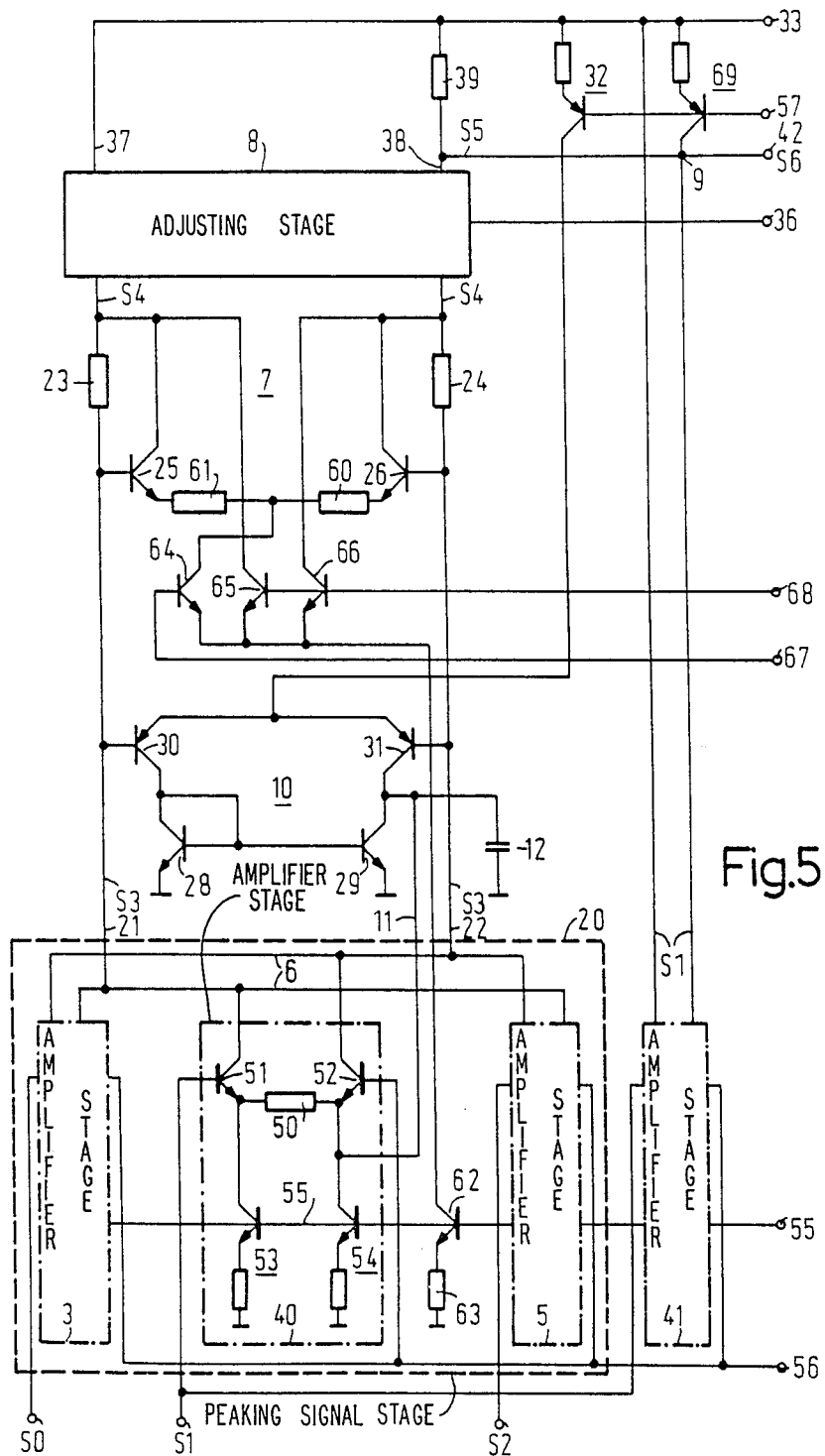

FIG. 5 shows the arrangement according to FIG. 4 in greater detail. The amplifier stage 40 comprises a pair of two differential amplifier transistors 51, 52 negatively fed back via a resistor, whose emitter terminals are fed by current sources 53 and 54 consisting of a current source transistor and a current source resistor. The current source transistors are controlled via their control terminals by a common reference voltage terminal 55. The other amplifier stages 3, 5, 41 have similar constructions and all of them are connected to the reference voltage terminal 55. The control terminal of the differential amplifier transistor 52 and the corresponding transistors in the amplifier stages 3, 5, 41 is connected to a further reference voltage terminal 56.

In the noise suppression stage 7 two emitter resistors 60, 61 are inserted in the connection of the emitter terminals of the transistors 25 and 26, and the dimensioning of these resistors provides the possibility of determining the voltage control range at the control terminals of the transistors 25, 26. The supply current source 27 is constituted by a current source transistor 62 with its associated current source resistor 63 connected to the reference voltage terminal 55 and by an adjusting transistor 64 arranged in series therewith, with which transistor and with the emitter resistors 60 and 61 and the main current paths of the transistors 25 and 26 two working point adjusting transistors 65, 66 are arranged in parallel. Correspondingly chosen voltages at the control inputs 57, 68 of the adjusting transistors 64 to 66 split up the current of the supply current source, i.e. from the current source transistor 62, into two fixed components over the working point adjusting transistors 65 and 66 and into a further component over the adjusting transistor 64. The current via the adjusting transistor 64 determines the amplitude threshold in the manner described. This arrangement ensures that the working point of, for example, the adjusting stage 8 remains unchanged, even when changing the amplitude threshold.

The constant current source 32 is formed in a similar manner as the current sources 53, 54 and 62, 63, but with a PNP transistor instead of an NPN transistor and it is connected to the power supply terminal 33. The current of the constant current source 32 is determined via a third reference voltage terminal 57 to which also a similar current source 69 supplying the amplifier stage 41 is connected. The reference voltage terminals 55, 56, 57 are preferably fed by a common reference voltage source (not shown) which supplies a plurality of reference voltages which are stabilised in the same manner.

In the arrangement according to FIG. 5 an additional direct current is directly applied from the working point control stage 10 via the line 11 to the emitter terminal of the differential amplifier transistor 52 of the amplifier stage 40. It directly influences the direct current in the push-pull current output 22 determining the zero point of the peaking signal S3. A separate working point current source 34 can be dispensed with when using this circuit. In a corresponding manner the current of the working point current source 35 of FIG. 4 is supplied by the current source 53. To this end the current source resistors of the current sources 53 and 54 are dimensioned differently. In the arrangement of FIG. 5 the constant current source 32 and the transistors 28 to 31 and the smoothing capacitor 12 jointly constitute an additional current source.

Figure 6:
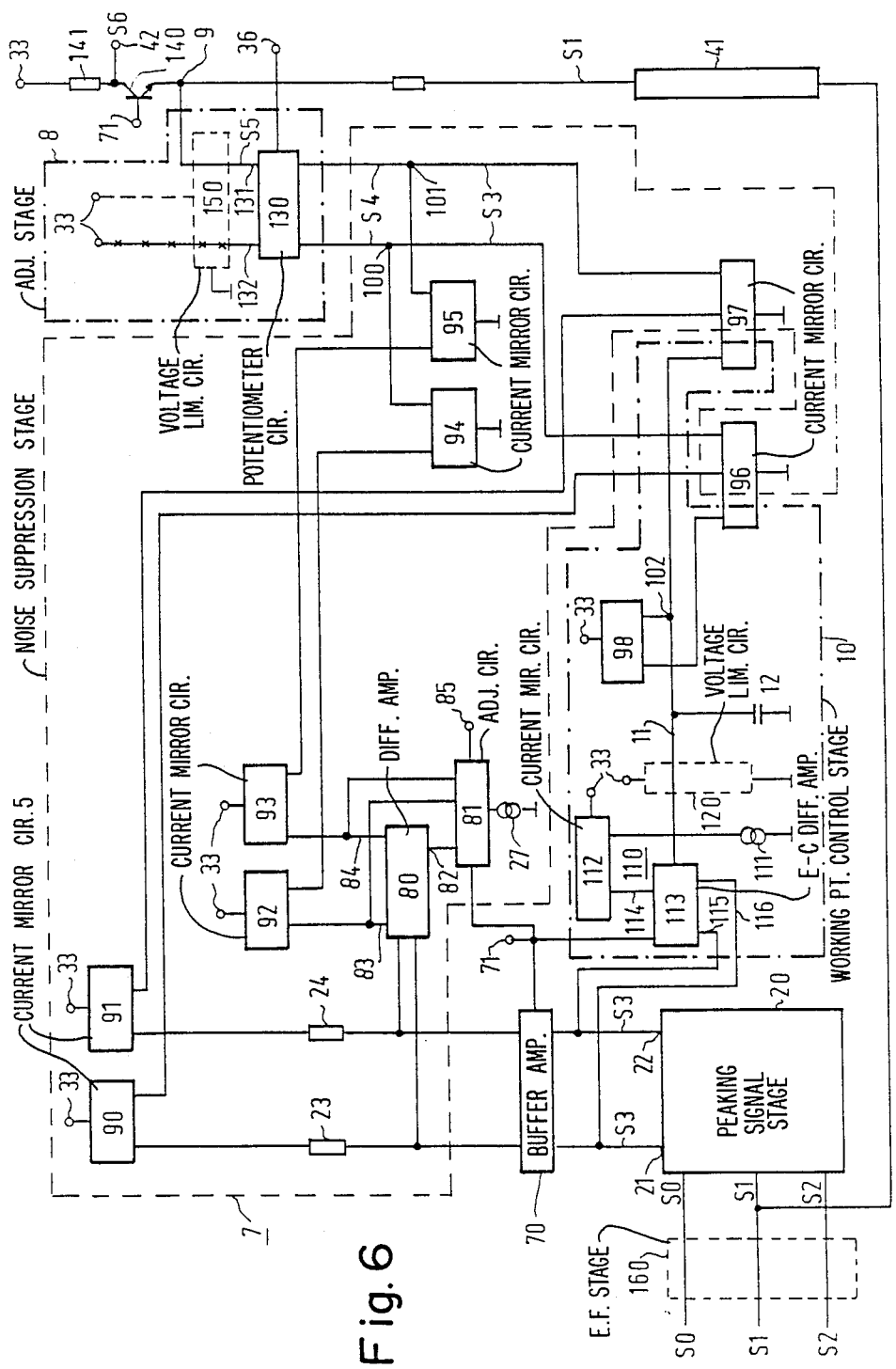
FIG. 6 shows another embodiment, particularly for operation at a lower supply voltage.

FIG. 6 shows another embodiment of a circuit arrangement which is suitable to be operated at a low power supply voltage and in which elements corresponding to those in the previous Figures have the same reference symbols and are shown in the form of a block diagram. The inner structure of the peaking signal stage 20 thus corresponds, for example, to the stage of FIG. 5 in which the peaking signal S3 is again applied to the push-pull current outputs 21, 22.

In FIG. 6 the peaking signal S3 from the peaking signal stage 20 is applied to the series resistors 23, 24 via a buffer amplifier 70. The buffer amplifier 70 preferably comprises a transistor for each of the push-pull current outputs 21, 22, and its main current path is arranged in series between the associated push-pull current outputs 21 and 22, respectively and the series resistors 23 and 24, respectively, and its control terminal is connected to a common reference voltage line 71. The buffer amplifier 70 is essentially used to decouple the parasitic capacitances at the push-pull current outputs 21 and 22 caused by the structure of the peaking signal stage 20 from the series resistors 23 and 24, so that a possible parasitic lowpass behaviour of the circuit arrangement caused by the cooperation of these elements is prevented. The currents constituting the peaking signal S3 are not changed thereby.

The noise suppression stage 7 comprises an emitter-coupled differential amplifier 80 which, similarly as in FIG. 5, comprises two transistors and possibly two emitter resistors. The voltages corresponding to the peaking signal at the junction points of the series resistors 23 and 24 and the buffer amplifier 70 are applied to the base terminals of the transistors, which terminals serve as control terminals. From the supply current source 27 a current is applied through an adjusting circuit 81 and split up into three components in this circuit. The adjusting circuit 81 preferably corresponds to the circuit comprising adjusting transistor 64 and working point adjusting transistors 65, 66 according to FIG. 5. The first current component feeds the emitter-coupled differential amplifier 80 at the input 82 whilst the other two current components, which are equal to each other, are applied via two further lines to the outputs 83 and 84, respectively, of the emitter-coupled differential amplifier 80. To adjust the working point, the adjusting circuit 81 is connected to the reference voltage line 71. The current component from the supply current source 27 applied via the emitter-coupled differential amplifier 80 can be changed or fully switched off via a switching input 85, whilst the sum of the currents supplied by the adjusting circuit 81 always remains constant so as not to shift the working point of the overall circuit arrangement.

The noise suppression signal from the outputs 83, 84 is twice mirrored via two pairwise arranged current mirror circuit 92, 93 and 94, 95 and the peaking signal S3 from the terminals of the series resistors 23, 24 remote from the buffer amplifier 70 is mirrored in a corresponding manner via twice two pairwise arranged current mirror circuits 90, 91 and 96, 97. Subsequently the signals formed by currents are superimposed on one another in two line nodes 100, 101 to form the signal S4.

As compared with the circuit arrangements of FIGS. 4 and 5, the relevant embodiment is suitable for operation at a low power supply voltage of, for example, between 5 and 8 V. To this end the number of series-arranged groups of components between the power supply terminal 33 and ground is minimised with the aid of the current mirror circuits 90 and 97 so that in spite of the low power supply voltage the required d.c. levels and signal voltage swings are ensured.

The current mirror circuits 90 to 95 conventionally comprise two current branches, for example in accordance with RCA Technical Notes No 949 of 31-12-1973. The current mirror circuits 90 to 93 particularly use the complementary circuits with PNP transistors. The current mirror circuits 96 and 97 are structurally different from the other current mirror circuits and are preferably formed in accordance with FIG. 9 of the RCA Technical Notes No. 949.

Signal currents corresponding to the currents in the series resistors 23, 24 forming the peaking signal S3 are derived from the outputs of the current mirror circuits 96, 97, which outputs are supplementary to those of the current mirror circuits 90 to 95. The signal current from the current mirror circuit 96 is mirrored via a further current mirror circuit 98 and subtractively superimposed on the signal current from the current mirror circuit 97 in a node 120 connected to the line 11. Thus, a signal corresponding to the difference between the currents from the current mirror circuits 96, 97 occurs on the line 11. The sum of the signal currents taken from the current mirror circuits 96, 97, which sum is constant due to the oppositely directed control by the currents constituting the peaking signal S3, takes over the role of the current of the constant current source 32 of FIG. 4 in this embodiment.

In the smoothing capacitor 12 peaking signal components are filtered from the control signal on the line 11 and the control signal thus smoothed is applied to an adjustable working point current source 110. This source comprises a constant current source 111 whose current is mirrored via a current mirror circuit 112 and which is applied as a supply current to a common emitter terminal 114 of an emitter-coupled differential amplifier 113. In the differential amplifier 113 the current from the constant current source 111 is distributed over two outputs 115, 116 dependent on the voltage difference between the reference voltage line 71 and the voltage on the line 11 representing the control signal, and these two outputs are connected to the push-pull current outputs 21, 22. Since the sum of the control currents at the outputs 115, 116 is constant, the control of the working point of the peaking signal S3 will leave its direct current level and hence its direct voltage level unchanged. Consequently, direct voltage shifts dependent on the control are obviated, which shifts would have an unfavourable effect on the voltage levels and voltage swings, particularly with respect to the low power supply voltage.

The line 11 may optionally include a voltage limiting circuit 120 in order to limit the voltage applied by the smoothing capacitor 12 to the differential amplifier 113 to a range which is sufficient for the complete control of this amplifier. This prevents excessive strong charge reversals of the smoothing capacitor 12 due to signal noise on the one hand and on the other hand the differential amplifier 113 is protected from overload.

The emitter-coupled differential amplifier 113 preferably has a negative feedback by which its gain is reduced in such a way that it does not introduce any noticeable additional noise in the peaking signal, which would reduce the effectivity of the noise suppression. The gain of the emitter-coupled differential amplifier 113 is only chosen to be such that the control steepness of the working point control influenced by this amplifier ensures a sufficiently low control error. On the other hand a rapid re-adjustment of the working point is not required.

The peaking signal S4 superimposed on the noise suppression signal is applied from the line nodes 100, 101 in the adjusting stage 8 via a potentiometer circuit 130 and is combined in the manner described with the useful signal S1 at the node constituting the further adder stage 9. The potentiometer circuit 130 comprises in known manner two emitter-coupled transistor pairs whose control terminals are cross-coupled and which constitute the adjusting input 36 for the adjusting signal for the amplitude adjustment of the peaking signals S3 and S4. The similarly cross-coupled collector terminals of the transistor pairs constitute outputs 131, 132 of the potentiometer circuit 130. Whilst the amplitude-adapted, low-noise peaking signal S5 is applied to the output 131, the output 132 is connected to the power supply terminal 33.

From the node constituting the further adder stage 9 the useful signal S6 with peaked edges is applied via a coupling-out circuit which comprises a transistor 140 and a collector resistor 141 arranged in series with its main current path. The emitter terminal of the transistor 140 is connected to the node 9, and the output 42 is connected to the collector terminal of the transistor 140. The voltage of the reference voltage line 71 is applied to the control terminal of the transistor 140. The transistor 140 is used for decoupling parasitic capacitances from the path of the useful signal S6.

Figure 7:
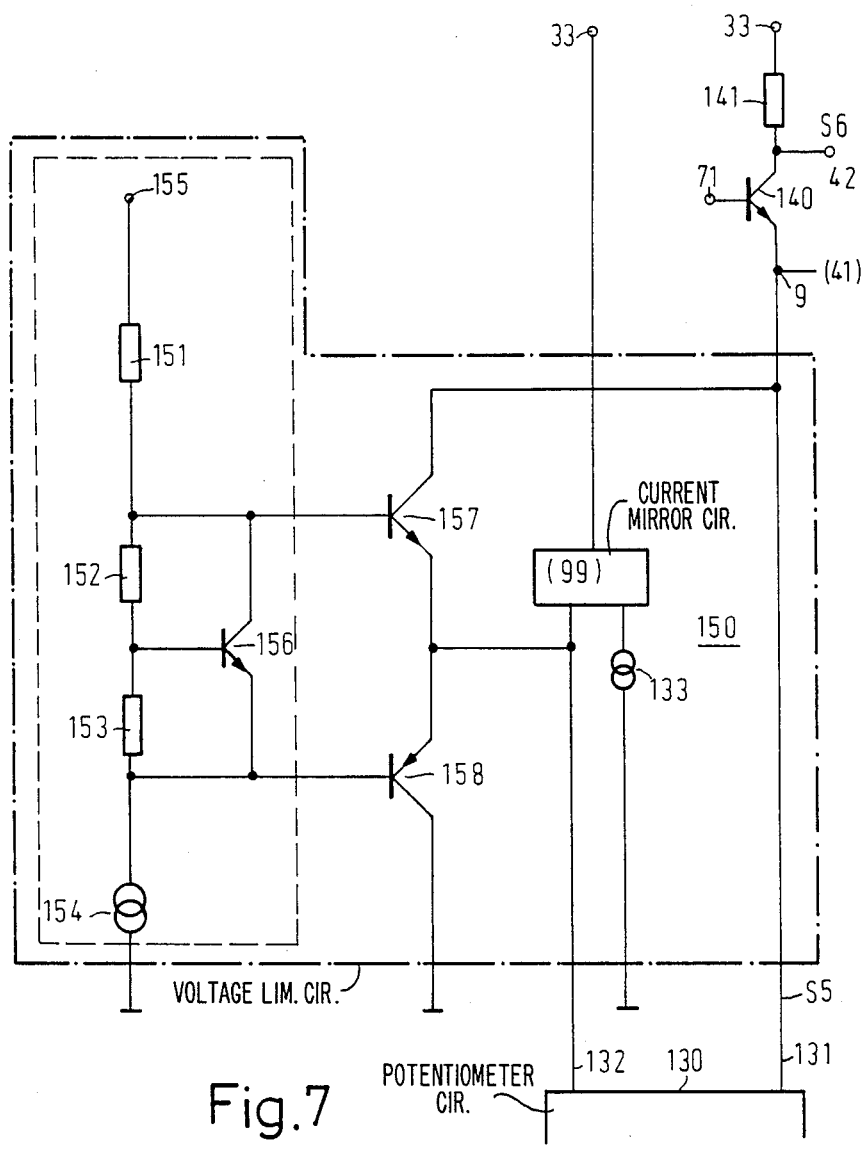
FIG. 7 is a circuit detail of a modification of FIG. 6.

The outputs 131, 132 of the potentiometer circuit 130 may be connected to a further voltage limiting circuit 150, a detailed embodiment of which is shown in FIG. 7. It comprises a voltage divider consisting of three resistors 151, 152 and 153 and a current source 154, all of which are series-arranged between a reference voltage terminal 155 and ground. The collector-base path of a transistor 156 shunts the resistor 152 and its base-emitter path shunts the resistor 153. The base terminals of two excess current transistors 157, 158 are connected to the collector and emitter terminals of the transistor 156. Such an arrangement is described in German Patent Application P No. 36 42 618.0, particularly in FIG. 12 and the associated description. The excess current transistors 157, 158 are complementary to each other and their emitter terminals are connected to the connection between the output 132 and the output of a current mirror circuit 99. The collector terminal of the excess current transistor 158 is connected to ground and that of the other excess current transistor 157 is connected to the node 9. The connection between the output 131 and the further adder stage 9 (node) in the modification according to FIG. 7 remains unchanged as compared with the arrangement of FIG. 6.

However, in FIG. 7 the output 132 is connected to the power supply terminal 33 via the current mirror circuit 99 which supplies the current of a current source 133 in the connection between its output, the excess current transistors 157, 158 and the output 132.

The voltage range of the useful signal S6 at the output 42 is determined by the resistance of the collector resistor 141 and the current control range of the outputs 131, 132. In the case of a small current at the output 131 a high voltage occurs at the collector resistor 141 so that the useful signal S6 assumes a low voltage value. Simultaneously a smaller current flows at the output 132, which current is supplied by the current source 133 via the current mirror circuit 99. However, the current of the current source 133 is dimensioned to be so large that it is larger than the current supplied to the output 132. The excess current is drained to ground via the excess current transistor 158.

In the case of a small current at the output 131, however, the useful signal S6 at the output 42 assumes a high voltage value. Simultaneously a large current which is larger than the current supplied by the current source 133 flows at the output 132. A current for balancing the current sum at the connection between the output 132, the current mirror 99 and the excess current transistors 157, 158 is then supplied via the excess current transistor 157, which current also flows via the collector resistor 141 and the transistor 140 and thus reduces the voltage value of the useful signal S6. The control range of the peaking signal S5 at the output 131, in which range the described voltage limitation of the useful signal S6 should be effective, is determined by the choice of the current of the current source 133.

The peaking signal stage 20 is advantageously preceded by an emitter follower stage 160, as is shown in FIG. 6. This results in known manner in an improved signal decoupling from previous signal processing stages.

The described circuit components are preferably combined on a semiconductor crystal in an integrated circuit, except for the smoothing capacitor 12 because of its size. The supply current source 27, the constant current source 111, the current sources 133, 154 and the peaking signal stage 20, the amplifier stage 41 and the emitter follower stage 160 are preferably connected to a common voltage reference determining all constant currents and voltages occurring therein. Together with the integration on a semiconductor crystal and in conjunction with the resistance tolerances which uniformly correspond to reference variations caused by production spreads, this results overall in very small errors during manufacture.

What is claimed is:

1. A circuit arrangement for reducing noise when peaking the edges of a useful signal by combination with a peaking signal derived therefrom, which signal only influences the useful signal when a predetermined amplitude threshold is exceeded, said arrangement comprising a peaking signal stage for supplying the peaking signal and a noise suppression stage in which a noise suppression signal is generated and is superimposed on the peaking signal, the peaking signal stage applying the peaking signal to two push-pull current outputs, characterized in that each of the push-pull current outputs (21, 22) in the noise suppression stage (7) is connected to a series resistor (23, 24) and to the control terminal of one of two transistors (25, 26) whose main current paths at one end are connected together and to a supply current source (27) and at the other end are connected to the terminal of the associated series resistor (23, 24) remote from the push-pull current output (21, 22, respectively).

2. A circuit arrangement as claimed in claim 1, characterized in that the current of the supply current source (27) is adjustable.

3. A circuit arrangement as claimed in claim 1, characterized by a working point control stage (10) which forms an additional direct current (at 11) for re-adjusting the direct current in at least one of the push-pull current outputs (22) from a comparison of two voltages derived from the push-pull current outputs (21, 22).

4. A circuit arrangement as claimed in claim 3, characterized in that the direct currents in the push-pull current outputs (21, 22) are re-adjusted in opposite directions by the additional direct current (at 11).

5. A circuit arrangement as claimed in claim 3, characterized by a constant current source (32) whose current is split up into two components corresponding to the voltages derived from the push-pull current outputs (21, 22), whilst the additional direct current (at 11) corresponds to the difference between said components.

6. A circuit arrangement as claimed in claim 3, characterized in that the additional direct current (at 11) is supplied to the peaking signal stage (20).

7. A circuit arrangement as claimed in claim 1, characterized in that the peaking signal (S3) and/or the noise suppression signal are applied via at least one current mirror circuit before they are superimposed.

8. A circuit arrangement as claimed in claim 7, characterized in that at least one of the current mirror circuits in the signal path of the peaking signal (S3) is arranged between the terminals of the series resistors (23, 24) remote from the push-pull current outputs (21, 22) and a circuit point for superimposing the noise suppression signal.

9. A circuit arrangement as claimed in claim 1, characterized by a voltage limiter stage which limits the peaking signal (S3) superimposed on the noise suppression signal in the polarity having the same direction as that of the useful signal (S1), such that the amplitude of the useful signal (S6) combined with the peaking signal does not exceed a given value above the value of the useful signal (S1).

* * * * *